United States Patent [19]

Huber

[11] Patent Number: 5,166,821
[45] Date of Patent: Nov. 24, 1992

[54] REDUCTION OF NON-LINEAR EFFECTS IN OPTICAL FIBER COMMUNICATION SYSTEMS AND METHOD OF USING SAME

[75] Inventor: David R. Huber, Warrington, Pa.

[73] Assignee: General Instrument Corporation, Hatboro, Pa.

[21] Appl. No.: 668,027

[22] Filed: Mar. 12, 1991

[51] Int. Cl.$^5$ .............................................. G02F 2/00
[52] U.S. Cl. ..................................... 359/238; 359/173; 359/181; 359/188; 385/1; 385/27; 385/122
[58] Field of Search .......................... 350/96.15, 96.16; 370/1-4; 372/6, 26-28; 455/606, 608, 609-612; 385/1-3, 15, 24, 27, 122; 359/115, 124, 127, 132, 160, 161, 173, 180, 181, 188, 195, 237, 238

[56] References Cited

U.S. PATENT DOCUMENTS 4,703,474 10/1987 Foschini et al. ................. 359/114 X
4,964,131 10/1990 Liu et al. ................................ 372/6

OTHER PUBLICATIONS

Graf, *Modern Dictionary of Electronics*, Sams & Co./Bobbs-Merrill Co., 4th Ed.—1972, p. 451.
Dixon, *Spread Spectrum Systems*, Wiley & Sons, 1976, pp. 13-21 and 269.
Lancaster, *CMOS Cookbook*, Sams & Co., 1st Ed.—1977, pp. 318, 320.

*Primary Examiner*—Brian Healy
*Attorney, Agent, or Firm*—Barry R. Lipsitz

[57] ABSTRACT

Non-linear effects in an optical fiber used for communicating AM signals at high power levels are reduced by increasing the linewidth of the pump laser output signal. The linewidth can be increased by optically broadening the laser output signal by driving an optical angle modulator with broadband electrical noise. The optical pump signal is then externally modulated with an AM information signal for transmission over an optical link fiber. The optical modulation can be provided using either an FM or PM optical modulator. A desired linewidth can be provided by controlling the optical modulation index during the optical modulation step and/or by controlling the bandwidth of the noise source.

20 Claims, 1 Drawing Sheet

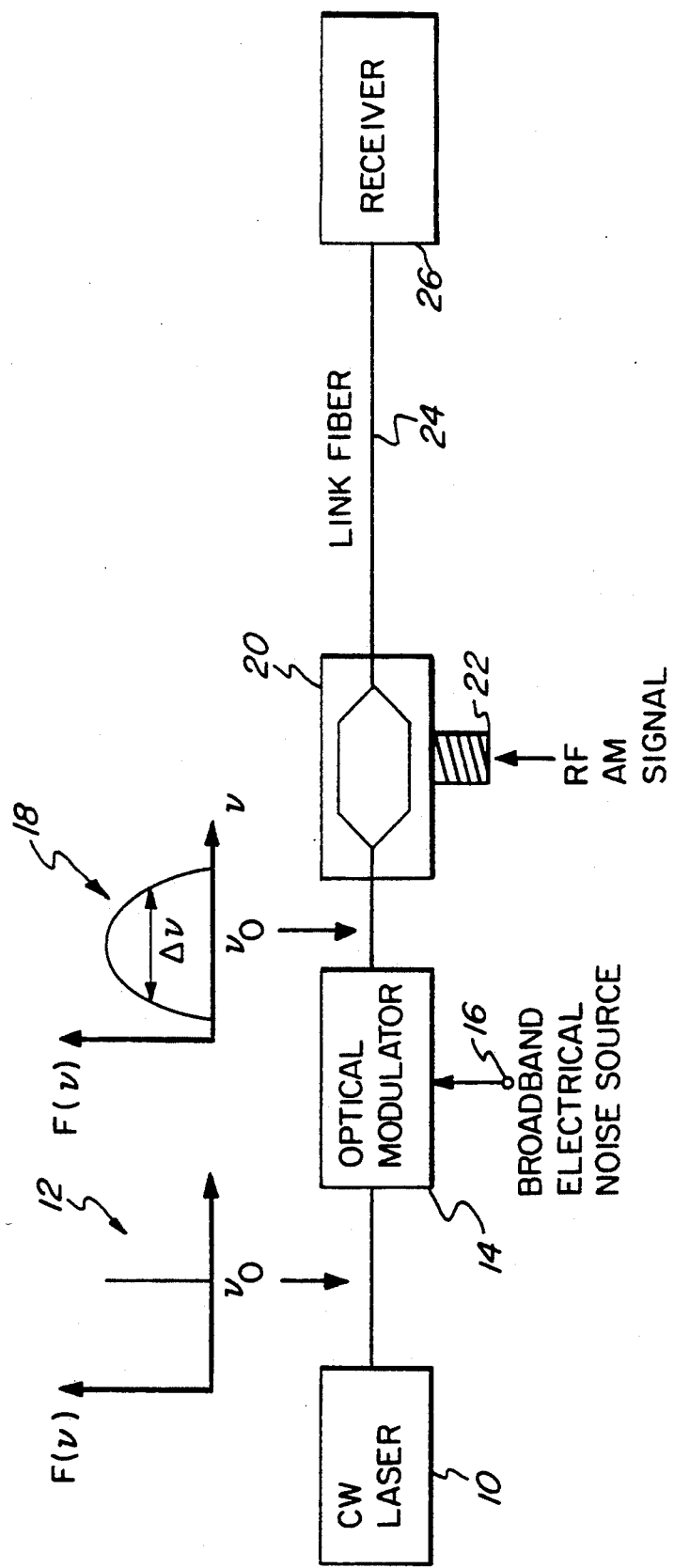

REDUCTION OF NON-LINEAR EFFECTS IN OPTICAL FIBER COMMUNICATION SYSTEMS AND METHOD OF USING SAME

BACKGROUND OF THE INVENTION

The present invention relates to optical fiber communication systems, and more particularly to a method and apparatus for reducing non-linear effects in an optical fiber used for communicating AM or other information signals.

Optical transmission systems are currently being implemented for use in various communication applications. For example, telephone systems are now in use that utilize optical fiber technology to transmit voice data signals over long distances. Similarly, cable television networks are available wherein optical fiber technology is used for the transmission of both analog and digital signals.

In order to transmit an information signal (e.g., a television signal) over an optical fiber, a light beam ("carrier") must be modulated with the information signal. The modulated carrier is then transmitted to a receiver via the optical fiber. At high power levels, silica fibers exhibit non-linear effects due to the interaction of the local electric field across the fiber and the fiber material. These non-linear effects also depend on the length of the fiber, with a cumulative degradation of performance resulting as the length of the fiber increases.

Among the non-linear effects exhibited in silica fibers at high power levels are four-wave mixing, Brillouin gain, and Raman gain. The magnitude of these interactions depend on the spectral density of the applied field. The power of the optical signal is also a factor in determining the severity of the non-linear effects.

Very little effect on signal transmission is seen below a threshold power density level. Beginning at a critical power density level, power will be shifted in wavelength by the non-linear interaction between the traveling wave and the material. Since optical fibers concentrate the power into a small cross section, the large fields required to make these effects significant arise at modest absolute power levels. For long distance signal transmission, these non-linear effects constitute an upper limit on the power level that can be transmitted. See, for example, Y. Aoki, K. Tajima and I. Mito, "Input Power Limits of Single-mode Optical Fiber Due to Simulated Brillouin Scattering in Optical Communications Systems," *IEEE Journal of Lightwave Technology*, May 1988, pp. 710–727 and Agrawal, Govind P., "Non-Linear Fiber Optics", Academic Press 1989, ISBN 0-12-045140-9. The non-linear effects in optical fibers are particularly troublesome for the transmission of amplitude modulated ("AM") signals, such as those used in conventional analog television signal broadcasting.

It would be advantageous to provide a method and apparatus for reducing the non-linear effects in optical fiber for the transmission of information signals, such as AM vestigial sideband television signals at high power levels. The present invention provides such a method and apparatus.

SUMMARY OF THE INVENTION

In accordance with the present invention, a method is provided for reducing non-linear effects in an optical fiber used for communicating information signals, such as AM information signals, at high power levels. In the common terminology used by those skilled in the art of non-linear interactions, the terms "pump wavelength" and "signal wavelength" are used to describe the stimulated Brillouin interaction. Using this terminology, the signal laser in accordance with the present invention plays the role of the pump laser. In this case, the classical signal laser is absent since there is no desire to use the Brillouin gain, which gain would limit the achievable transmission distance and increase the system relative intensity noise from 0 Hz up to subcarriers a few times the Brillouin bandwidth.

In the present invention, a laser output signal is provided. The linewidth of the laser output signal is increased to provide a broadened optical signal. The optical signal is externally modulated with an information signal (e.g., an AM signal), and coupled to an optical link fiber for transmission to a receiver. In order to increase the linewidth of the laser output signal, the laser output is optically modulated by broadband electrical noise. The noise can be either frequency modulated or phase modulated on the broadened optical signal. The bandwidth of the noise and/or the optical modulation index used during the optical modulation step is controlled to provide a desired linewidth for the broadened optical signal.

Apparatus in accordance with the present invention includes a light source for providing an optical carrier. Means are provided for optically modulating the carrier by broadband electrical noise. External modulator means, coupled to receive the optically modulated carrier, modulate the carrier with an information signal. Means are provided for coupling the information modulated carrier from the external modulator means to an optical transmission path such as an optical fiber. The optical modulating means can comprise an optical frequency modulation ("FM") modulator or an optical phase modulation ("PM") modulator. The light source can comprise a continuous wave ("CW") laser.

BRIEF DESCRIPTION OF THE DRAWING

The drawing is a block diagram illustrating the various components of apparatus in accordance with the present invention.

DETAILED DESCRIPTION OF THE INVENTION

In accordance with the present invention, the non-linear effects exhibited in an optical fiber at high power levels due to the spectral density of the optical signal are reduced to a level enabling the transmission of AM communication signals at relatively high power levels. Currently, a high power solid state or semiconductor laser for use in communications will produce a signal on the order of 30 milliwatts or so. The output powers of such lasers are increasing at a rapid pace, and output powers on the order of four watts or so are expected to become commercial in the future. It is expected that even higher power lasers will be available for communication purposes in the not too distant future.

High power optical communication systems are advantageous in that a signal can be split into a plurality of paths (e.g., in a tree and branch distribution network). In addition, high power enables the signals to be transmitted over longer distances without the need for signal amplification. This reduces the cost of the communication system. Non-linear effects such as four-wave mixing and Brillouin gain have hampered efforts to provide a cost effective high power optical communication system for AM signals, such as television signals transmitted over a cable television network. In order to overcome the non-linear effects for relatively high power AM signals communicated over an optical fiber, the present invention increases the effective linewidth of the carrier light source (e.g., laser) to reduce the effects of fiber nonlinearity. Broadening the optical linewidth reduces the spectral density of the signal, distributing the same power over a broader range.

As an example, the Brillouin gain threshold is reduced by the ratio $\Delta v_P/\Delta v_B$ where $\Delta v_P$ is the optical linewidth (i.e., the linewidth of the optical field that induces the non-linearity) and $\Delta v_B$ is the gain bandwidth of the Brillouin gain. For typical single mode fibers, $\Delta v_B$ is approximately equal to 100 MHz. For a distributed feedback ("DFB") laser, the effective $\Delta v_P$ is several GHz. When a CW laser and an external modulator serve as the pump laser, $\Delta v_P$ can be as small as a few kilohertz depending on the specific source laser. Thus, a wide range of $\Delta v_P$ can exist, depending on the type of laser used.

Practical vestigial sideband AM systems that use external modulators typically have a modulation index of less than 50 percent. This means that over half of the optical power is concentrated within $\Delta v_P$ at $v_o$, where $v_o$ is the optical frequency of the non-linear pump. For a typical single mode fiber having a Brillouin gain bandwidth of about 100 MHz, a laser providing a linewidth of two kHz will produce a gain $\Delta v_B/\Delta v_P = 50,000$. For a DFB laser having a linewidth of six GHz, the Brillouin gain $\Delta v_B/\Delta v_P = 0.016$. Thus, we see the Brillouin gain is much higher for the laser which has a 2 kHz linewidth.

In accordance with the present invention, the output of a semiconductor or solid state laser having a narrow linewidth is optically broadened by an optical angle modulator (e.g., frequency or phase modulation) driven by broadband electrical noise (e.g., white noise having a 100 MHz to 300 MHz bandwidth) to effectively increase the optical linewidth. As illustrated in the Figure, continuous wave laser 10 produces an optical spectrum 12 having an optical frequency $v_o$. The narrow linewidth of the laser output signal is increased by modulating it with broadband electrical noise input to an optical modulator 14 at terminal 16. The resultant spectrum 18 output from optical modulator 14 has a substantially increased linewidth $\Delta v$. This optical signal, still centered around optical frequency $v_o$, serves as an optical carrier for communication of an information signal to a conventional receiver 26 over a link fiber 24.

In order to modulate the optical carrier with the information signal, an external modulator 20 is provided. This modulator can comprise, for example, an electrooptic device such as a Mach Zehnder modulator. External optical modulators are well known in the art. See, e.g., S. E. Miller, T. Li, and E. A. J. Marcatili, "Research Toward Optical Fiber Transmission Systems", Proc. IEEE, Vol. 61, pp. 34-35, Dec. 1973. In the embodiment illustrated in the figure, an RF AM signal, such as an AM VSB television signal, is input to external modulator 20 via coaxial cable input terminal 22. The AM modulated optical carrier is then received by receiver 26 via the link fiber.

Optical modulator 14 can comprise either a phase modulator or a frequency modulator. The linewidth of the signal output from modulator 14 is selected by controlling the bandwidth of the electrical noise source and/or the optical modulation index of the optical modulator. Optical phase modulators that can be used in connection with the present invention are commercially available. For example, the Model PM 315 modulator sold by Crystal Technology of Palo Alto, Calif. and the Model IOC 1000 modulator sold by BT&D of Wilmington, Del.

It should now be appreciated that the present invention provides an apparatus and method for reducing the non-linear effects in link fiber by increasing the optical linewidth of the signal laser. The optical linewidth is increased by modulating the laser output with broadband electrical noise using an optical modulator. This spreads the linewidth to reduce the effects of cable non-linearities. As a result, second and third order distortion components that would otherwise be introduced by four-wave mixing and the increase in relative intensity noise that would be introduced by Brillouin gain, as well as other non-linear effects are reduced to an acceptable level. The method and apparatus of the present invention are effective for reducing any fiber non-linear effect that depends on the optical spectral density of the pump laser.

Although the invention has been described in connection with a particular embodiment, those skilled in the art will appreciate that numerous modifications and adaptations may be made thereto without departing from the spirit and scope of the invention as set forth in the claims.

What is claimed is:

1. A method for reducing non-linear effects in an optical fiber used for communicating optical signals, comprising the steps of:
   providing a laser output signal having a mode at a frequency $v_0$;
   increasing the linewidth of said mode to provide a broadened optical signal generally centered around $v_0$;
   externally modulating said broadened optical signal with an information signal; and
   coupling the modulated broadened optical signal to an optical link fiber for transmission to a receiver.

2. A method in accordance with claim 1 wherein said linewidth increasing step comprises the step of optically modulating said laser output signal by broadband electrical noise.

3. A method in accordance with claim 2 wherein said optical modulating step comprises frequency modulation.

4. A method in accordance with claim 2 wherein said optical modulating step comprises phase modulation.

5. A method in accordance with claim 2 comprising the further step of:
   controlling the bandwidth of said noise to provide a desired linewidth for the broadened optical signal.

6. A method in accordance with claim 2 comprising the further step of:
   controlling the optical modulation index during said optical modulation step to provide a desired linewidth for the broadened optical signal.

7. A method in accordance with claim 6 comprising the further step of:
   controlling the bandwidth of said noise in conjunction with said optical modulation index to provide a desired linewidth for the broadened optical signal.

8. A method in accordance with claim 2 wherein said noise is white noise having a bandwidth of about 100 MHz to 300 MHz.

9. A method in accordance with claim 1 wherein said information signal is an AM signal.

10. Apparatus for communicating optical signals over an optical fiber comprising:
   a light source for providing an optical carrier;
   means for optically modulating said carrier by broadband electrical white noise to provide a broadened optical carrier;
   external modulator means, coupled to receive the broadened optical carrier, for modulating said broadened carrier with an information signal; and
   means for coupling the broadened carrier modulated with said information signal from said external modulator means to an optical transmission path.

11. Apparatus in accordance with claim 10 wherein said optical modulating means comprise an optical FM modulator.

12. Apparatus in accordance with claim 10 wherein said optical modulating means comprise an optical PM modulator.

13. Apparatus in accordance with claim 10 wherein said light source comprises a CW laser.

14. Apparatus in accordance with claim 10 wherein said white noise has a bandwidth of about 100 MHz to 300 MHz.

15. Apparatus in accordance with claim 10 wherein said information signal is an AM signal.

16. Apparatus for communicating optical signals over an optical fiber comprising:
   a light source for providing an optical carrier;
   means for optically modulating said carrier by broadband electrical noise to provide a broadened optical carrier;
   external modulator means, coupled to receive the broadened optical carrier, for modulating said broadened carrier with an AM information signal; and
   means for coupling the broadened carrier modulated with said information signal from said external modulator means to an optical transmission path.

17. Apparatus in accordance with claim 16 wherein said optical modulating means comprise an optical FM modulator.

18. Apparatus in accordance with claim 16 wherein said optical modulating means comprise an optical PM modulator.

19. Apparatus in accordance with claim 16 wherein said light source comprises a CW laser.

20. Apparatus in accordance with claim 16 wherein said noise is white noise having a bandwidth of about 100 MHz to 300 MHz.

* * * * *